United States Patent [19]

Artinano et al.

[11] Patent Number: 4,539,480
[45] Date of Patent: Sep. 3, 1985

[54] ELECTRICAL ISOLATION SYSTEM

[75] Inventors: Antonio T. Artiñano; Hernan N. Jiménez; Bernal C. Thalman; Marco A. E. Vásquez, all of San José, Costa Rica

[73] Assignee: Cibertec S.A., San José, Costa Rica

[21] Appl. No.: 439,916

[22] Filed: Nov. 8, 1982

[51] Int. Cl.³ .............................................. G02B 27/00
[52] U.S. Cl. ................................. 250/551; 307/311; 455/617; 455/619
[58] Field of Search .................. 330/59, 308; 455/606, 455/607, 617, 612, 619, 602; 307/311; 250/551

[56] References Cited

U.S. PATENT DOCUMENTS

| | | | |
|---|---|---|---|
| 3,818,235 | 6/1974 | Johnson et al. | 250/551 |
| 3,955,149 | 5/1976 | Trilling | 330/59 |
| 3,968,361 | 7/1976 | Bumgardner | 307/311 |
| 4,032,843 | 6/1977 | Loucks | 330/59 |
| 4,041,331 | 8/1977 | Westerman et al. | 307/311 |
| 4,079,272 | 5/1978 | Howatt | 307/311 |

Primary Examiner—David C. Nelms
Assistant Examiner—J. Gatto

[57] ABSTRACT

An electrical isolation system formed of a pair of optically interconnected emitter-receiver systems of similar character disposed in input and output loop circuits with associated means to balance a signal induced current in the input loop with a control induced current in the output loop circuit.

11 Claims, 6 Drawing Figures

ELECTRICAL ISOLATION SYSTEM

This invention relates to the electrical isolation of interrelated electrical circuitry and particularly to methods and apparatus for electrically isolating one electrical subcircuit from an operationally interrelated second electrical subcircuit.

The susceptibility of operationally interrelated electrical subcircuits to disruptive externally generated electrical and electromagnetic interference has been a common and long-standing problem in the electrical arts. Among the many diverse areas which have been particularly affected by such disruptive interference effects have been those associated with measurement, instrumentation and control equipment and more particularly equipment in such areas which are normally characterized by electrical input signals of small magnitude and requiring output signals of relatively great magnitude. Still another broad area where electrical isolation of operationally interrelated electrical circuitry is a matter of concern is that of medical equipment and associated instrumentation where effective electrical isolation of the patient or subject is an important consideration. Measuring and control equipment are generally particularly susceptible to different types of interference which may markedly affect both the sensed and derivative signals in the processing of the information therein. Such interference sources are mainly electromagnetic in nature, such as radio frequency wave induction, power line induction, electrical and electromagnetic noise induction due to motor starting, triggering of protections, gas discharge lamps, inductive circuit commutation, electrical arcs, atmospheric discharges, welding equipment, and the like. Still another area where effective electrical isolation of operationally interrelated subcircuits is desirous are those cases in which considerable distances separate the different subcomponents of the system and the communications and measuring instruments thus giving rise to ground loops which make utilization of single reference potential difficult, if not often times a practical impossibility.

Over the years many expedients have been both sugggested and employed in efforts to minimize, if not avoid, such undesirable interference effects. Apart from shieldings, among the more common expedients so employed has been the use of transformers wherein signal transfer was effected through a magnetic field. Apart from the basic inability to transfer a d.c. signal except through modulation and demodulation of an a.c. carrier, transformers are susceptible to magnetic field interference and to distortion problems due to the nonlinear characteristics attendant hysteresis effects in the cores thereof. Additionally transformer based isolation has become dimensionally disproportionate as printed circuit techniques and ever progressing miniaturization of circuit components has become a prime objective of the art.

Other and more recent sugggested expedients for electrical subcircuit isolation have been implemented by the use of optical coupling techniques. However, while such optical couplers have demonstrated a utility in the isolation of digital signals, they are, when used in the linear field, generally characterized by problems of nonlinearity, instability with temperature, susceptibility to changes in power supply voltage and ageing effects. Present day utilization of optical couplers in linear isolation systems conventionally employ modulation techniques similar to those employed in transformers. In those instances where optical coupling is employed for linear direct current signals, the desired linear transfer is usually effected by biasing the circuit so that the signals to be transferred represent small deviations about the operating point. Such technique however has the marked disadvantage of making it difficult, if not practically impossible to distinguish variations in signal strength from changes in bias caused by temperature, power supply variations and component ageing.

The subject invention may be briefly described, in its broad aspects, as an improved electrical isolation system for employing transfer of light energy between analog current loops. In somewhat narrower aspect, the invention includes the optical coupling of two operationally interrelated electrical subcircuits for the permitted linear transfer of unmodulated d.c. signals through ultrasonic a.c. signals. In its still more narrower aspects, the subject invention may be briefly described as an electrical isolation system that includes a pair of optically interconnected emitter-receiver systems of similar character disposed in input and output loop circuits in association with a current equalizing system to provide for precise matching of input and output loop currents therein. In a still more narrow aspect, the invention may be briefly described as an improved electro-optical isolation system for measuring, instrumentation and control systems and particularly for such fields where the interchange of information requires the use of current loops to minimize the effects of interference and electrical noise.

Among the advantages of the subject invention is the provision of an improved electrical isolating system of high stability and linearity; an electrical isolating system that has a flat response over a range of frequencies from d.c. to ultrasonic; that does not require modification of the input signal; that provides current as well as voltage outputs proportional to input current; that maintains input loop continuity even with failure of the input element; that can be used with both linear and nonlinear optical transfer elements; that is effectively independent of the potential differences extant between the input and output circuits and that is totally electronic in character. Still further advantages are a simple and inexpensive system utilizing readily available, small sized and low cost components that may be used in effecting isolation of signals in measuring and in control systems; that may be used in effecting isolation in the transmission of audio signals and in the prevention of ground loops and that may also be used in association with medical equipment where patient isolation is a desirable, if not essential, requirement. Still further advantages are a highly stable electrical isolation system that is effectively impervious to temperature, component ageing and power supply fluctuations and which is relatively insensitive to magnetic fields.

The primary object of this invention is the provision of an improved electrical isolation system.

A further object of this invention is the provision of an improved, linear electro-optical isolation system of highly stable character and formed of simple and inexpensive components.

Another object of this invention is the provision of an electrical isolation system for measurement and control apparatus which can accommodate large potential differences between the input and output thererof and which does not require modulation of the input signal.

Other objects and advantages of the subject invention will become apparent from the following portions of this specification and from the appended drawings which illustrate, in accord with the mandate of the patent statutes, a presently preferred embodiment incorporating the principles of this invention.

Referring to the drawings.

Figure 1:
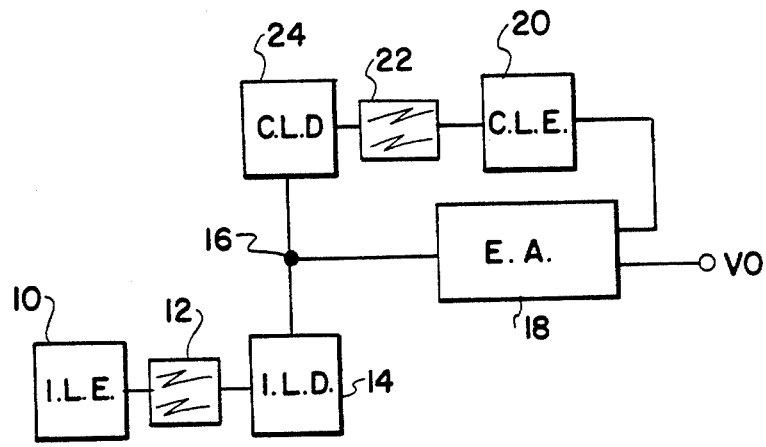
FIG. 1 is a schematic block diagram of the isolation system incorporating the principles of this invention.

Referring initially to FIG. 1, there is provided an input light emitter 10 optically coupled through any type of optical transmission element, generally designated 12 and suitably constituted of light transmitting fibers, to an input light detector 14. The light reaching the input light detector 14 induces an error current flow through junction node point 16, which current flow is amplified by the error amplifier 18 and produces a control current flow through the control light emitter 20. The control current flow through the control light emitter 20 generates light of sufficient intensity, after transmission by a similar type of optical transmission element, here generally designated 22, as that employed in the input loop, to produce a current flow in the control light detector 24 of a magnitude to balance the current flow at junction node 16 and thus cancel the error. The current flowing through the control light emitter necessary to cancel the error at junction node 16 will be directly proportional to the current flowing through the input light emitter 10.

In such described system, a direct current may be transmitted in linear direct form through a light emitter-transmitter-receiver system, which in itself may be non-linear without any need for modulating or conditioning of the input signal. Additionally, the use of similar emitter-transmitter-receiver systems in both the input and output provides both excellent linearity and stability characteristics. Additionally, the error amplifier 18 provides a voltage output signal (Vo) of a magnitude proportional to the magnitude of the input signal current. Such permits the reading of output both by voltage and current outputs. Likewise, variations due to temperature and ageing of optical components are effectively cancelled out since they result in opposing current flow variations at junction node 16.

Figure 2A:
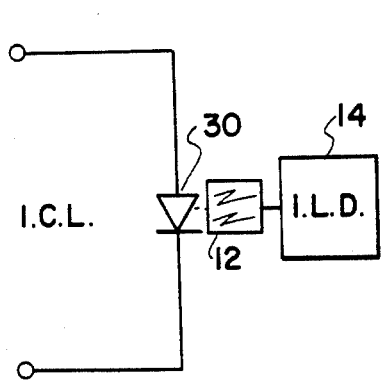
FIGS. 2a through 2d are simplified circuit diagrams of the light-emitting portion of the input loop system components showing various constructions thereof.
Figure 2B:
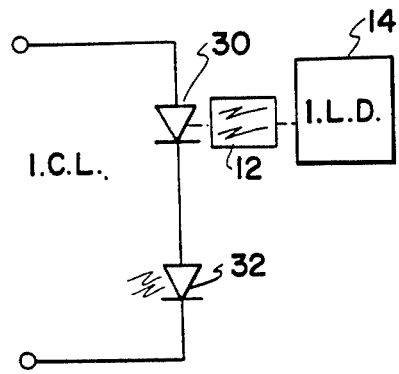
Figure 2C:
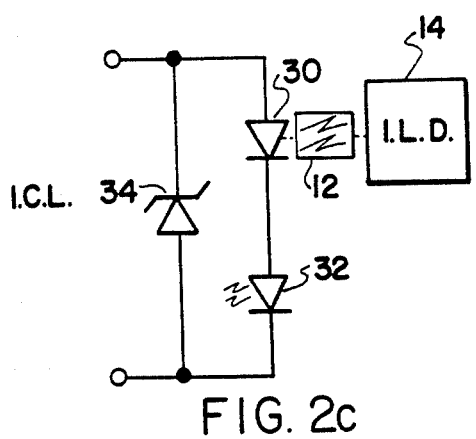

FIG. 2a shows the simplest version of the external loop input where a light-emitting element 30, suitably a light-emitting diode is the only necessary component therein. Such a light-emitting diode 30 will introduce a voltage drop of about 1.8 volts therein, which readily permits the connection of several instruments in the same input loop. For example, if it is desired to visually monitor the current flowing in the input loop a second light-emitting diode 32 can be included therein as shown in FIG. 2b. As shown in FIG. 2c a zener diode 34 may be included in order to guarantee input loop continuity in case of failure of either of the light-emitting diodes 30 and 32 and to protect them from polarity reversals. Similarly a third light-emitting diode 36 may be included in series with zener diode 34 to provide a visual indication of failure of diodes 30 or 32. A capacitor 38 may also be included to filter the input signal from interference caused by other instruments possibly connected to the same loop.

Figure 2D:
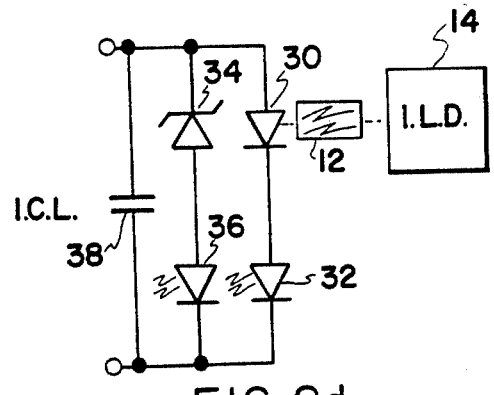
Figure 3:
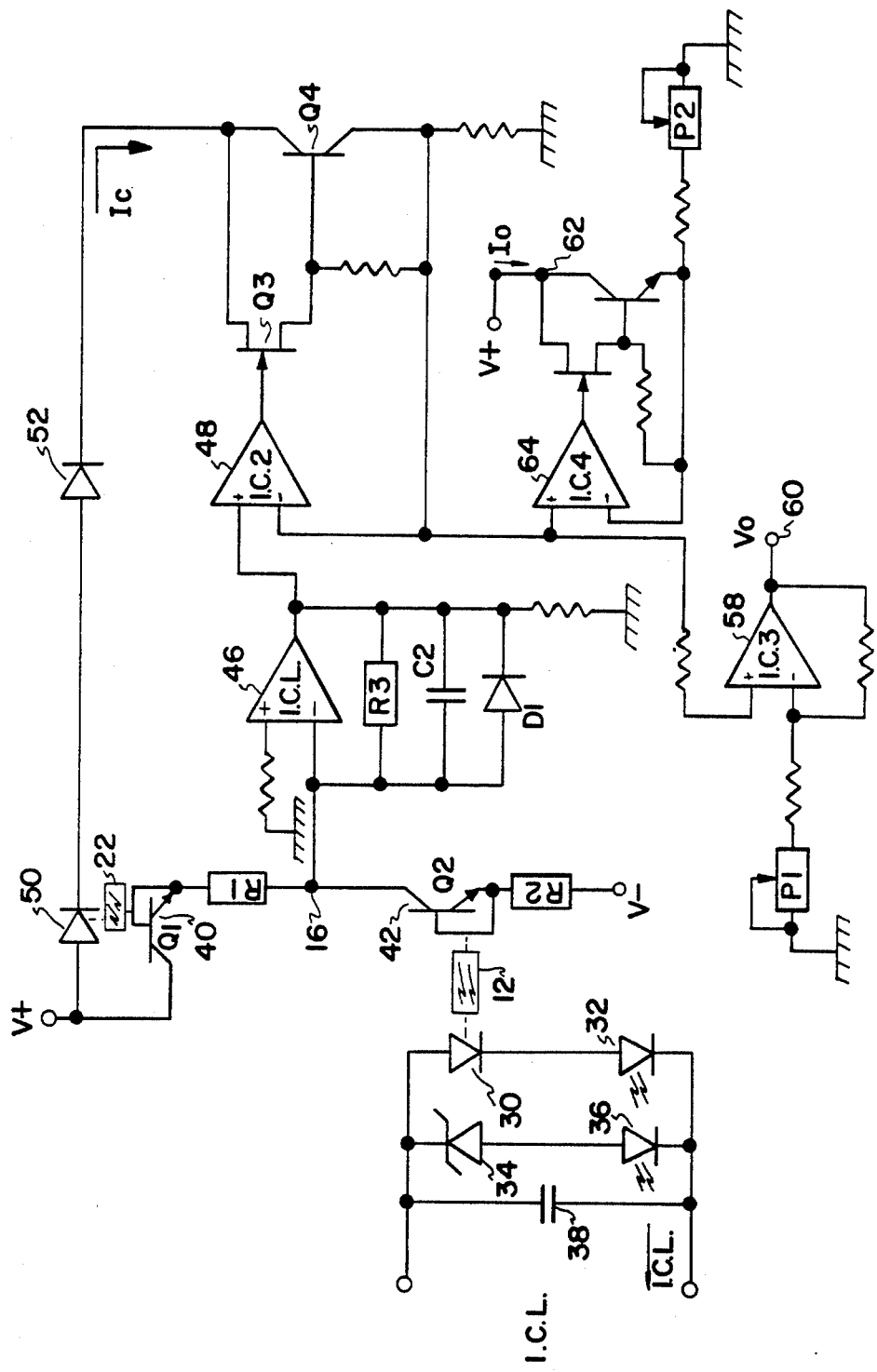
FIG. 3 is a simplified circuit diagram of a presently preferred embodiment of an electro-optical isolation system incorporating the principles of this invention.

Referring now to FIG. 3 the input control loop there employed is that embodied in FIG. 2d and described above. The input light detector 14 suitably comprises a first photo detector 42 in series with a resistor (R2) connected intermediate junction node 16 and negative voltage supply (V—). Similarly the control light detector 24 comprises a photo detector 40 connected in series with a resistor R1 intermediate junction node 16 and a positive voltage supply (V+). Current balance at junction node 16 occurs when the current flowing through photo detector Q1 equals that flowing through photo detector Q2. Any current difference at junction node 16, such as would occur by a variation in light emitted by the light-emitting diode 30 will be detected by ICL amplifier 46. As shown amplifier 46 is paralleled by resistor R3, capacitor C2 and diode D1. The output voltage is ICL amplifier 46 is converted into a control current IC by IC2 amplifier 48 in circuit with transistors Q3 and Q4. Control current IC flows through the control light-emitting diode 50 and visual monitory diode 52 connected in series with the positive voltage supply (V+). The control current IC flowing through light-emitting diode 50 results in the emission of light which is transmitted through optical transmission element 22 to photo detector 40 to increase current flow therethrough and reduce the net current flow at junction node 16 to zero. As will be apparent to those skilled in this art, capacitor C2 functions to enhance system stability at high frequencies and diode D1 functions to prevent the output of ICL amplifier 46 from going negative in case the current through photo detector 40 exceeds that flowing through photo detector 42.

If system operation desirously requires an output voltage signal Vo that is of a magnitude proportional to the input current, such can be provided by the auxiliary voltage circuit that includes IC3 amplifier 58 and adjustable potentiometer P1. The voltage output Vo at output terminal 60 provides a measurable signal that is of a magnitude proportional to the magnitude of the input current.

If system operation desirably requires an adjustable current output, such can be provided at junction node 62 through the illustrated auxiliary subcircuit which includes IC4 amplifier 64 and potentioneter P2.

Having thus described our invention, we claim:

1. A linear isolation circuit system for interconnecting two operationally interrelated subcircuits comprising an input circuit including
first light-emitting means for producing a quantum of light proportional to the magnitude of an electrical signal to be transmitted,
first photo detector means responsive to the quantum of light produced by said first light-emitting means for generating a first selectively directed electrical current at a junction point of a magnitude proportional to said quantum of light emitted by said first light-emitting means, and
first light transmitting means for optically transmitting said quantum of light from said first light-emitting means to said first photo detector means;
an output circuit including
second light-emitting means for producing a quantum of light proportional to the magnitude of a control current flowing therethrough, second photo detector means responsive to the quantum of light produced by said second light-emitting means for generating a second electric current of a magnitude proportional to said quantum of light produced by said second light-emitting means and selectively directed toward said junction point in opposition to said first selectively directed current generated by said first photo detector means, second light transmitting means for optically transmitting said quantum of light from said second light-emitting means to said second photo detector means, amplifier means responsive to the magnitude of said first current from said first photo detector at said junction point for producing said control current for said second light-emitting means in a magnitude to effect the emission of sufficient light therefrom to render the magnitude of said second current equal to that of said first current, whereby the magnitude of said control current for said second light emitting means is proportional to the magnitude of said electrical signal and is electrically isolated therefrom.

2. A linear isolation system as set forth in claim 1 wherein said first light-emitting means comprises a light-emitting diode having a low voltage drop thereacross.

3. A linear isolation system as set forth in claim 2 wherein said input circuit includes an auxiliary light-emitting diode connected in series with said first light-emitting diode for visually monitoring the flow of current through said first light-emitting diode.

4. A linear isolation system as set forth in claim 1 wherein said input circuit includes a zener diode paralleling said first light-emitting means to maintain input loop continuity independent of the operational status of said first light-emitting means.

5. A linear isolation system as set forth in claim 1 wherein said first and second optical light-transmitting means are of similar electrical operational character.

6. A linear isolation system as set forth in claim 1 wherein said first and second optical light-transmitting means are of nonlinear character.

7. A linear isolation system as set forth in claim 5 wherein said first and second optical light-transmitting means are constituted of light-transmitting fibers.

8. A linear isolation circuit system as set forth in claim 1 including means associated with said amplifier means to provide a voltage output of a magnitude proportional to said electrical signal to be transmitted.

9. A linear isolation circuit system as set forth in claim 1 wherein said first light-emitting means, first photo detector means and first light-transmitting means included in said input circuit are essentially similar in electrical operational character to the second light-emitting means, second photo detector means and second light-transmitting means included in said output circuit respectively.

10. A linear isolation circuit for interconnecting two operationally interrelated subcircuits comprising an analog input loop including a light emitter and a photo detector interconnected by light transmission means for generating a first selectively directed electric current through a junction joint adjacent said photo detector of a magnitude proportional to a signal applied to said light emitter, an analog output loop including a light emitter and a photo detector interconnected by light-transmission means for generating a second and oppositely directed electric current through said latter photo detector and said junction joint in response to passage of a control current through said output loop light emitter, and amplifier means responsive to the magnitude of said first electric current at said junction point for generating said control current in a magnitude that results in the magnitude of said second current equalling that of said first current.

11. A linear isolation circuit as set forth in claim 10 wherein the light emitters, photo detectors and light-transmission means in said input and output loops are of similar electrical operational character.

* * * * *